US009985527B2

(12) United States Patent
Yaguchi (10) Patent No.: US 9,985,527 B2
(45) Date of Patent: May 29, 2018

(54) SWITCHING POWER SUPPLY WITH SHORT CIRCUIT DETECTION

(71) Applicant: Fuji Electric Co., Ltd., Kanagawa (JP)

(72) Inventor: Yukihiro Yaguchi, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days. days.

(21) Appl. No.: 15/696,679

(22) Filed: Sep. 6, 2017

(65) Prior Publication Data
US 2018/0123457 A1    May 3, 2018

(30) Foreign Application Priority Data

Oct. 29, 2016   (JP) .................................. 2016-212383

(51) Int. Cl.
| | |
|---|---|
| H02M 3/158 | (2006.01) |
| H02M 1/42 | (2007.01) |
| G05F 1/10 | (2006.01) |
| H02M 1/00 | (2006.01) |

(52) U.S. Cl.
CPC ......... *H02M 3/158* (2013.01); *H02M 1/4225* (2013.01); *G05F 1/10* (2013.01); *H02M 2001/0032* (2013.01); *H02M 2001/0038* (2013.01); *H02M 2001/0041* (2013.01); *H03K 2217/0036* (2013.01)

(58) Field of Classification Search
CPC ........ H02M 1/32; H02M 1/42; H02M 1/4208; H02M 1/4225; H02M 2001/0032; H02M 2001/0041; H03M 3/158
See application file for complete search history.

(56) References Cited

U.S. PATENT DOCUMENTS

| | | | | |
|---|---|---|---|---|
| 5,867,379 | A * | 2/1999 | Maksimovic | ....... H02M 1/4225 323/222 |
| 6,984,963 | B2 | 1/2006 | Pidutti et al. | |
| 7,116,090 | B1 | 10/2006 | Yang et al. | |
| 9,876,432 | B2 * | 1/2018 | Sugawara | ......... H02M 3/33507 |
| 2004/0263140 | A1 * | 12/2004 | Adragna | ................... G05F 1/70 323/282 |

(Continued)

FOREIGN PATENT DOCUMENTS

| | | |
|---|---|---|
| JP | 2009-148043 A | 7/2009 |
| JP | 2009-177954 A | 8/2009 |

*Primary Examiner* — Yusef A Ahmed
(74) *Attorney, Agent, or Firm* — Chen Yoshimura LLP (57) ABSTRACT

A switching power supply includes: a switching device connected between a power supply input terminal and a ground terminal via an inductance element; an output circuit that generates a prescribed output voltage by rectifying and smoothing current obtained from the inductance element as the switching device is switched ON and OFF; an output voltage control circuit that controls an ON time of the switching device on the basis of a feedback voltage obtained through the output voltage of the output circuit; and a short-circuit detection circuit that outputs a short-circuit detection signal by detecting short-circuits in the switching device on the basis of a voltage applied to a control terminal of the switching device when the switching device is ON, the short-circuit detection signal being used to control operation of the output voltage control circuit so as to gradually reduce the ON time of the switching device.

9 Claims, 4 Drawing Sheets

(56) References Cited

U.S. PATENT DOCUMENTS

| | | | |
|---|---|---|---|
| 2007/0063684 A1* | 3/2007 | Adragna | H02M 1/32 323/284 |
| 2009/0190382 A1 | 7/2009 | Usui | |
| 2010/0002474 A1* | 1/2010 | Moon | H02M 1/4225 363/21.18 |
| 2010/0110593 A1* | 5/2010 | Kim | H02M 1/32 361/18 |
| 2010/0165683 A1* | 7/2010 | Sugawara | H02M 1/4225 363/126 |
| 2010/0301824 A1* | 12/2010 | Yamamoto | H02M 3/156 323/283 |
| 2011/0095733 A1* | 4/2011 | Park | H02M 1/4225 323/207 |
| 2012/0044724 A1* | 2/2012 | Morota | H02M 3/33523 363/21.17 |
| 2012/0099234 A1* | 4/2012 | Inoue | H02M 1/08 361/87 |
| 2012/0153719 A1* | 6/2012 | Inaba | B60L 3/003 307/10.1 |
| 2012/0201063 A1* | 8/2012 | Sugawara | H02M 1/4225 363/89 |
| 2014/0085949 A1* | 3/2014 | Sugawara | H02M 1/4225 363/89 |
| 2014/0177302 A1* | 6/2014 | Sung | H02M 1/32 363/89 |
| 2015/0137784 A1* | 5/2015 | Sugawara | H02M 3/156 323/282 |
| 2015/0263514 A1* | 9/2015 | Koishi | H02M 1/08 361/93.7 |
| 2016/0105096 A1* | 4/2016 | Chen | H02M 1/4225 323/210 |
| 2016/0181942 A1* | 6/2016 | Sugawara | H02M 3/156 363/126 |
| 2016/0241011 A1* | 8/2016 | Onishi | H03K 17/0822 |
| 2016/0341776 A1* | 11/2016 | Sekine | H02M 1/32 |
| 2017/0019030 A1* | 1/2017 | Sugawara | H02M 1/4225 |
| 2017/0366090 A1* | 12/2017 | Sugawara | H02M 3/158 |

* cited by examiner

FIG. 4
Prior Art

SWITCHING POWER SUPPLY WITH SHORT CIRCUIT DETECTION

BACKGROUND OF THE INVENTION

Technical Field

The present invention relates to a switching power supply that includes a switching device connected via an inductance element to a power supply input terminal and that generates a DC output voltage by rectifying and smoothing current output via the inductance element as the switching device is switched ON and OFF.

Background Art

One type of switching power supply is a step-up chopper-type power factor correction converter (PFC), in which the self-oscillation of an inductance element is utilized to create an input current proportional to an input voltage while generating a stable DC output voltage. As described in Patent Document 1, for example, this type of switching power supply (a power factor correction converter (PFC)) offers a number of advantages, such as being small in size, high in efficiency, and low in cost.

Figure 4:
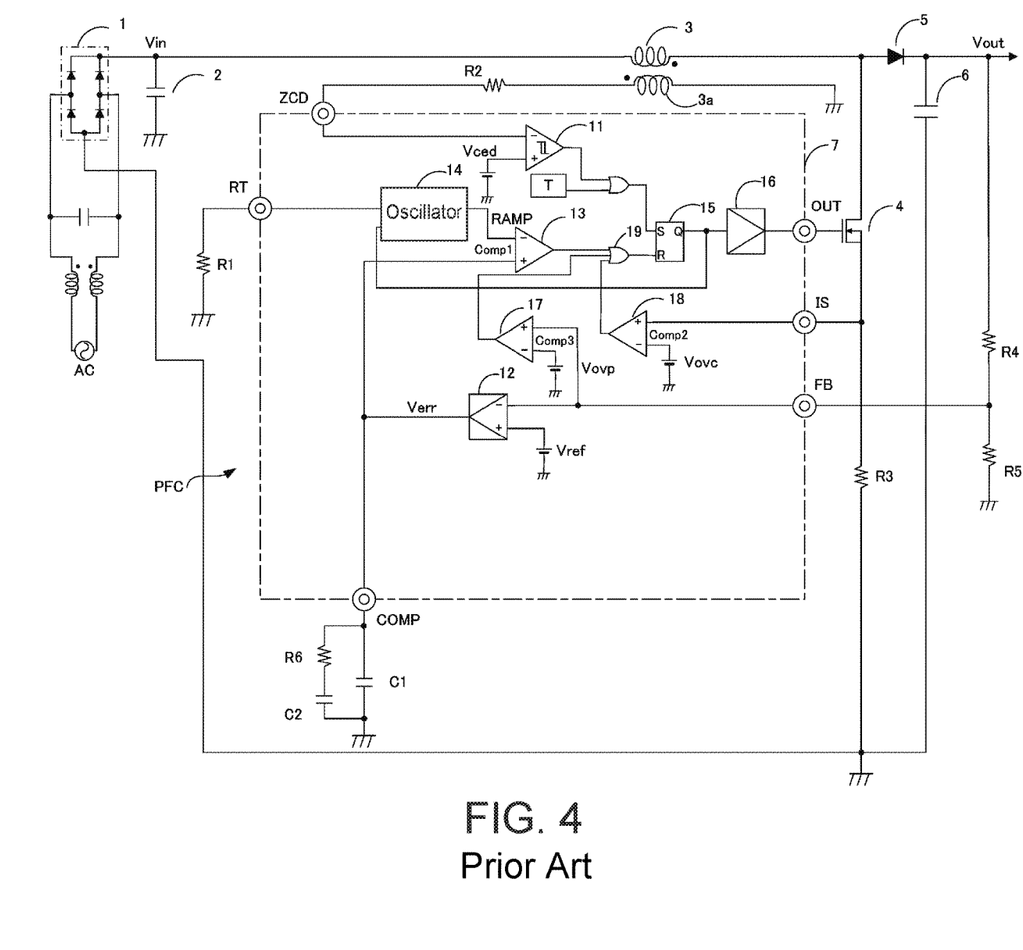
FIG. 4 schematically illustrates an example of a configuration of a conventional switching power supply (power factor correction converter).

FIG. 4 schematically illustrates an example of a configuration of such a conventional switching power supply (power factor correction converter). This switching power supply (power factor correction converter) PFC includes an inductance element 3 connected to an AC power source AC via a rectifier circuit 1 as well as a switching device 4 that, when ON, forms a current path running through the inductance element 3. The switching device 4 is a power MOSFET, for example.

The switching power supply PFC further includes a voltage output circuit that obtains a prescribed DC output voltage Vout by rectifying and smoothing current obtained from the inductance element 3 while the switching device 4 is OFF. This voltage output circuit includes a diode 5 and an output capacitor 6. Furthermore, the switching power supply PFC also includes a controller 7 that controls the ON/OFF switching of the switching device 4 in accordance with a voltage difference between the DC output voltage and a target output voltage. This controller 7 is commonly known as a power supply IC. Moreover, the reference character 2 in the figure is an input capacitor that obtains an input voltage Vin by smoothing the output of the rectifier circuit 1.

Next, the controller (power supply IC) 7 will be described briefly. The controller 7 includes a zero-current detector (comparator) 11 that detects when current flowing through the inductance element 3 due to a voltage induced in a secondary coil 3a of the inductance element 3 becomes equal to zero. The zero-current detector 11 outputs a signal for switching ON the switching device 4. The controller 7 further includes an error amplifier 12 that obtains an error voltage Verr between a reference voltage Vref and the voltage of a feedback voltage detected by voltage-dividing the DC output voltage Vout via resistors R4 and R5. The error amplifier 12 is a so-called conductance amplifier.

Furthermore, the controller 7 also includes a pulse-width modulation (PWM) control circuit (comparator) 13 that compares the voltage of the error voltage Verr detected by the error amplifier 12 with the voltage of a ramp voltage RAMP generated and output by an oscillator 14. The oscillator 14 begins oscillating when triggered by the switching device 4 being switched ON and generates the ramp voltage RAMP, in which the oscillation waveform (that is, the slope at which the voltage changes) is determined by a resistor R1 connected to an RT terminal. The PWM control circuit 13 generates a signal for switching the switching device 4 OFF when the voltage of the ramp voltage RAMP exceeds the voltage of the error voltage Verr. The PWM control circuit 13 controls the ON time of the switching device 4 in accordance with the voltage of the error voltage Verr.

The controller 7 further includes a flip-flop 15 and a driver circuit 16 that is driven by the output of the flip-flop 15. The flip-flop 15 is set by a signal output from the comparator (zero-current detector) 11 and is reset by a signal output from the comparator (PWM control circuit) 13. Moreover, the driver circuit 16 controls the gate voltage of the switching device (power MOSFET) 4 in accordance with the output of the flip-flop 15 in order to switch the switching device 4 ON and OFF accordingly.

Furthermore, the feedback voltage detected via the resistors R4 and R5 is input to an overvoltage detector (comparator) 17. In addition, a voltage detected by a shunt resistor R3 connected in series to the switching device 4 is input to an overcurrent detector (comparator) 18. When the overvoltage detector (comparator) 17 detects an overvoltage in the output voltage Vout or when the overcurrent detector (comparator) 18 detects an overcurrent in the current flowing through the switching device 4, the flip-flop 15 is force-reset via an OR circuit 19.

The controller 7 configured as described above typically switches the switching device 4 ON once the current flowing through the inductance element 3 becomes equal to zero (zero-current switching). When the switching device 4 is switched ON, current proportional to the voltage of the input voltage Vin obtained via the rectifier circuit 1 begins flowing through the inductance element 3. This current (inductor current) increases, starting from zero, while the switching device 4 remains ON.

Moreover, the controller 7 switches the switching device 4 OFF when the voltage of the ramp voltage RAMP that begins to be generated when triggered by the switching device 4 being switched ON exceeds the voltage of the error voltage Verr (voltage mode). When the switching device 4 is switched OFF, the polarity of the voltage built up in the inductance element 3 inverts, and the current flowing through the inductance element 3 is output from the inductance element 3 via the diode 5. The capacitor 6 is charged by the current thus extracted from the inductance element 3 and smooths the resulting charge voltage to generate the output voltage Vout, which has a prescribed voltage that is controlled in accordance with the voltage of the error voltage Verr to remain constant.

Once the inductor current returns to zero, the controller 7 switches the switching device 4 back ON to begin the next operation cycle. The controller 7 then continues switching the switching device 4 ON and OFF as described above. Here, in this controller 7, all of the components that contribute to control of an ON time of the switching device 4 on the basis of the error voltage Verr between the prescribed reference voltage Vref and a feedback voltage FB obtained by detecting an output voltage from the terminal OUT constitute an output voltage control circuit. Such an output voltage control circuit may also include components that determine OFF timing of the switching device 4, as the case may be.

The input voltage Vin applied to the inductance element 3 has a voltage waveform that changes in magnitude over each half-period of a sine wave. However, when using the voltage mode described above to control the ON/OFF switching of the switching device 4, the ON time Ton of the switching device 4 remains constant regardless of the phase of the input voltage Vin. As a result, the current supplied to the inductance element 3 becomes insufficient at phase angles at which the instantaneous value of the input voltage Vin is low (low-voltage phases), which increases occurrence of so-called dead angles (phases at which no voltage is applied) and thus decreases the power factor.

Therefore, in some switching power supplies PFC, the ON time Ton of the switching device 4 is increased at phase angles at which the instantaneous value of the input voltage Vin is low (low-voltage phases) to a value greater than that used at phase angles at which the instantaneous value of the input voltage Vin is high (high-voltage phases) in order to improve the power factor (see Patent Documents 2 and 3, for example). Patent Document 2 discloses a scheme in which the phase of the input voltage Vin is obtained by detecting the peak value of the inductor current (which is proportional to the voltage of the input voltage Vin), and the ON time Ton of the switching device 4 is then adjusted accordingly. Moreover, Patent Document 3 discloses a scheme in which the phase of the input voltage Vin is obtained by detecting a derivative of the inductor current (which is proportional to the voltage of the input voltage Vin), and the ON time Ton of the switching device 4 is then adjusted accordingly.

RELATED ART DOCUMENTS

Patent Documents

Patent Document 1: Japanese Patent Application Laid-Open Publication No. 2009-177954
Patent Document 2: U.S. Pat. No. 6,984,963
Patent Document 3: U.S. Pat. No. 7,116,090

SUMMARY OF THE INVENTION

However, in the switching power supply (power factor correction converter) PFC configured as described above, if a short-circuit occurs between the source and gate of the switching device 4, for example, while mounting components such as the switching device 4 and the controller 7 on a prescribed circuit board, an extremely large current may flow to the source of the switching device 4 from an output terminal OUT of the controller 7 that drives the gate of the switching device 4. If this happens, the extremely large current that flows from the output terminal OUT of the controller 7 to the source of the switching device 4 may potentially damage the controller 7.

The present invention was made in light of the foregoing and aims to provide a switching power supply that makes it possible to effectively prevent damage to an integrated controller including an output voltage control circuit even if short-circuits occur in a switching device that is switched ON and OFF by the controller. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a switching power supply, including: a switching device connected in series to an inductance element and arranged between an input power supply and a ground terminal; an output circuit that rectifies and smooths current output through the inductance element from the input power supply as the switching device is switched ON and OFF; an output voltage control circuit that controls an ON time of the switching device on the basis of an error voltage between a prescribed reference voltage and a feedback voltage obtained by detecting an output voltage of the output circuit; and a short-circuit detection circuit that detects a voltage applied to a control terminal of the switching device when the switching device is ON, determines that a short-circuit has occurred in the switching device if the voltage becomes less than a prescribed threshold value, and outputs a short-circuit detection signal to control operation of the output voltage control circuit so as to reduce the ON time of the switching device to be less than when there is no short-circuit.

It is preferable that the switching device be an n-type MOSFET, and that the short-circuit detection circuit detect a voltage between a source and gate of the n-type MOSFET when the n-type MOSFET is switched ON by the output voltage control circuit. Moreover, it is preferable that the output voltage control circuit and the short-circuit detection circuit be integrated together an integrated circuit that switches the switching device ON and OFF.

It is preferable that the short-circuit detection circuit output the short-circuit detection signal only after the voltage applied to the control terminal of the switching device remains less than the prescribed threshold value for a prescribed duration of time. Moreover, it is preferable that the output voltage control circuit, upon receiving the short-circuit detection signal, reduce an operating frequency at which the switching device is switched ON and OFF.

Furthermore, it is preferable that the short-circuit detection circuit superimpose the short-circuit detection signal onto the voltage difference between the feedback voltage and the prescribed reference voltage input to the output voltage control circuit. In addition, it is preferable that the short-circuit detection circuit, after a prescribed period time from when a short-circuit is detected has elapsed, gradually reduce a voltage produced by superimposing the short-circuit detection signal onto the error voltage between the feedback voltage and the prescribed reference voltage input to the output voltage control circuit.

In the switching power supply configured as described above, when the short-circuit detection circuit detects a short-circuit between the source and gate of the switching device (power MOSFET) caused by an external factor while the switching device (power MOSFET) is ON, the ON time of the switching device is gradually reduced. Furthermore, the operating frequency at which the switching device is switched ON and OFF is reduced.

As a result, while the switching device is ON, the current flowing to the source of the switching device (power MOSFET) from the integrated controller (power supply IC) including the output voltage control circuit is gradually reduced. This effectively prevents the integrated controller from being damaged by current flowing from the controller to the source of the switching device when short-circuits occur between the source and gate of the switching device due to external factors.

Moreover, the switching power supply according to the present invention as described above simply has to reduce the ON time of the switching device. This makes it possible to quickly restore the functionality of the controller once the external factor that caused the short-circuit between the source and gate of the switching device (power MOSFET) is removed. This, in turn, makes it possible to prevent undesirable damage to the controller as well as to reuse the controller by integrating it into another switching power supply, thereby achieving a variety of practically advantageous effects such as making it possible to utilize controllers more effectively. It is to be understood that both the foregoing general description and the following detailed description are exemplary and explanatory, and are intended to provide further explanation of the invention as claimed.

DETAILED DESCRIPTION OF EMBODIMENTS

Next, a switching power supply (power factor converter) PFC according to an embodiment of the present invention will be described with reference to figures.

Figure 1:
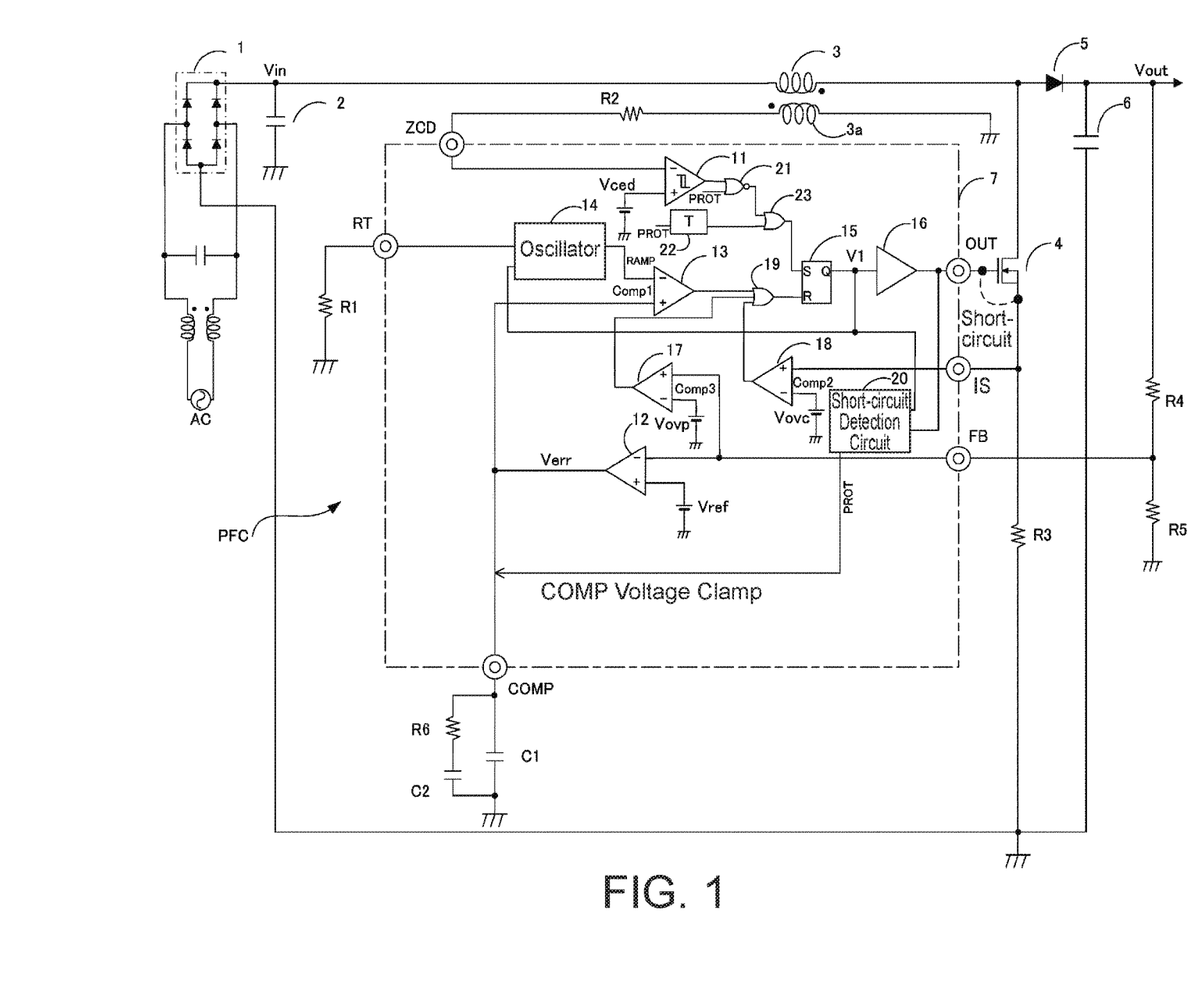
FIG. 1 schematically illustrates a configuration of a switching power supply (a power factor correction converter) according to an embodiment of the present invention.

FIG. 1 schematically illustrates a configuration of the switching power supply (power factor converter) PFC according to the present embodiment. Note that the same reference characters are used for components that are the same as in the conventional switching power supply (power factor converter) PFC illustrated in FIG. 4, and that redundant descriptions of such components that are the same will be omitted.

The switching power supply (power factor converter) PFC according to the present embodiment is characterized in that it includes, in addition to the configuration of the switching power supply (power factor converter) PFC illustrated in FIG. 4 and described above, a short-circuit detection circuit 20 that detects the voltage between the source and gate of a switching device (power MOSFET) 4, particularly while the switching device (power MOSFET) 4 is ON. It is preferable that the short-circuit detection circuit 20 be integrated into a controller (power supply IC) 7.

The short-circuit detection circuit 20 detects short-circuits between the source and gate of the switching device (power MOSFET) 4 that are caused by external factors and outputs a short-circuit detection signal PROT. The short-circuit detection signal PROT output from the short-circuit detection circuit 20 is input to a NOR gate circuit 21 to be logically combined with the output of a zero-current detector (comparator) 11 and is also input to a restart timer circuit 22. Moreover, the short-circuit detection signal PROT is applied to a COMP terminal of the controller (power supply IC) 7.

Here, while the short-circuit detection signal PROT is being output, the NOR gate circuit 21 prevents a flip-flop 15 from being set by the output of the zero-current detector (comparator) 11. Moreover, the restart timer circuit 22 starts a timer upon being triggered by the short-circuit detection signal PROT and then outputs a timer signal after a prescribed period of time has elapsed. This timer signal is input to the flip-flop 15 via the OR circuit 23, thereby setting the flip-flop 15. Therefore, once a short-circuit has been detected in the switching device 4, the switching device 4 is prevented from switching ON when a zero current is detected, and the switching device 4 is then switched ON by the output of the restart timer circuit 22 instead.

In addition, the COMP terminal is grounded via a capacitor C1, and a series circuit constituted by a resistor R6 and a capacitor C2 is connected in parallel to the capacitor C1. The capacitors C1 and C2 and the resistor R6 correct the phase of an error voltage Verr that is output from an error amplifier 12 and input to a PWM control circuit (comparator) 13. Furthermore, as described above, the short-circuit detection circuit 20 applies the short-circuit detection signal PROT to the signal generated at the COMP terminal, thereby clamping a COMP voltage (the error signal Verr) that is input to the PWM control circuit (comparator) 13.

The short-circuit detection circuit 20 takes as inputs an output signal V1 of the flip-flop 15 (which is also the input signal for a driver circuit 16) as well as a voltage signal that is output from the driver circuit 16 and then output from an output terminal OUT of the controller 7, for example, and detects short-circuits between the source and gate of the switching device (power MOSFET) 4 that is connected to the output terminal OUT. In other words, when the output V1 of the flip-flop 15 is at a high level, the short-circuit detection circuit 20 detects that the switching device 4 is in the ON state. Moreover, the short-circuit detection circuit 20 detects short-circuits between the source and gate of the switching device (power MOSFET) 4 from the voltage of the output terminal OUT while the switching device 4 is in the ON state.

Figure 2:
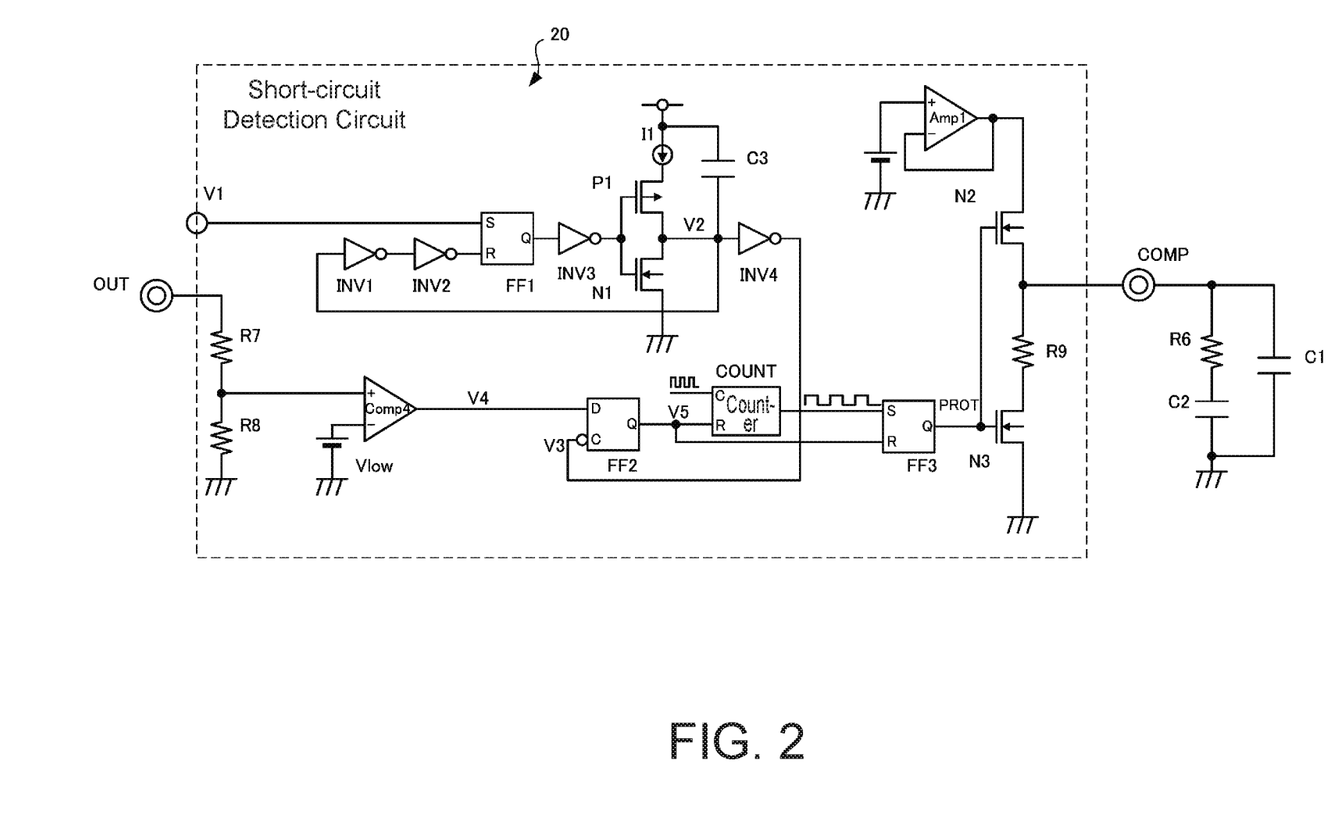
FIG. 2 illustrates an example of a configuration of a short-circuit detection circuit to be integrated into a controller (a power supply IC).
Figure 3:
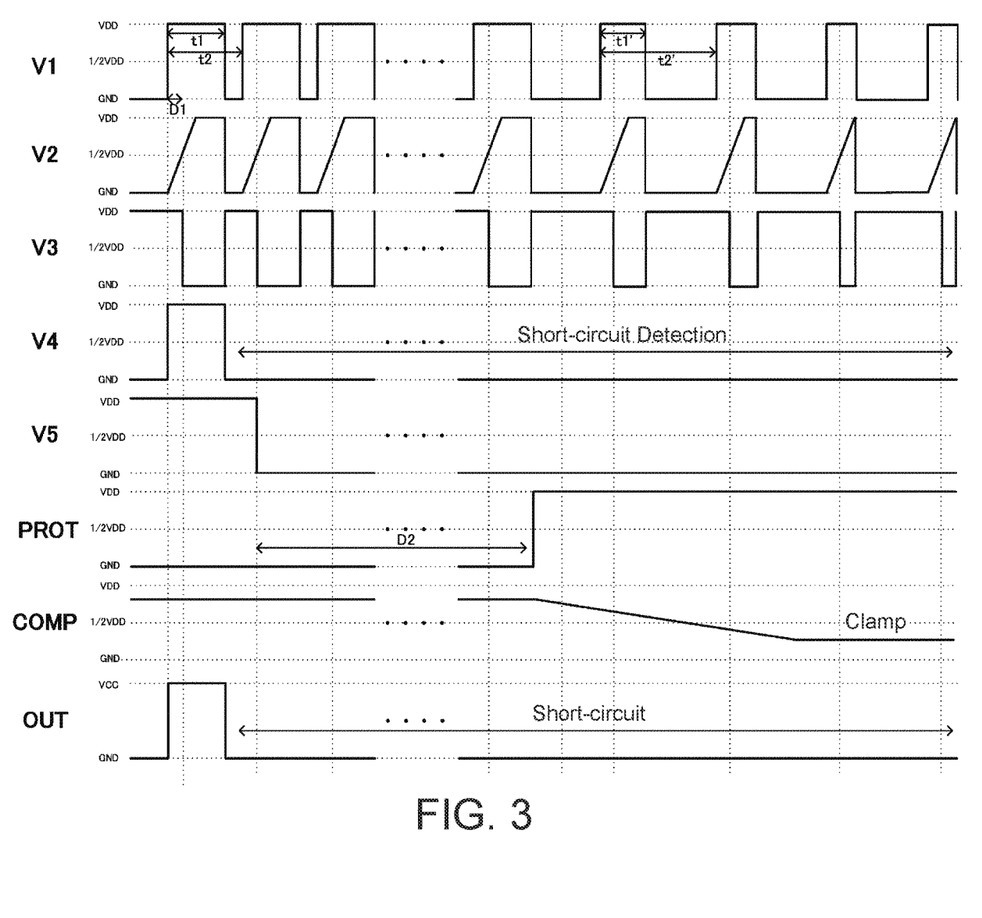
FIG. 3 illustrates how the operation of a switching device is controlled in the switching power supply (power factor correction converter) illustrated in FIG. 1.

The short-circuit detection circuit 20 is configured as illustrated in FIG. 2, for example. Moreover, FIG. 3 is a signal waveform diagram illustrating the operation of the short-circuit detection circuit 20. The short-circuit detection circuit 20 includes a flip-flop FF1 that is set when the output signal V1 is set to the high level. A pair of a cascade-connected p-type MOSFET (P1) and an n-type MOSFET (N1) respectively receive a set output Q from the flip-flop FF1 via an inverter circuit INV3 and alternately switch ON and OFF. The ON/OFF switching of the p-type MOSFET (P1) and the n-type MOSFET (N1) controls the charging/discharging of a capacitor C3 connected in parallel to the p-type MOSFET (P1).

Here, when the output signal V1 is at the high level (H) and the p-type MOSFET (P1) is ON, the capacitor C3 is charged by a constant current source I1. As the capacitor C3 is charged, the voltage of the drain voltage V2 of the n-type MOSFET (N1) increases. This drain voltage V2 is fed back to the flip-flop FF1 via two stages of inverter circuits INV1 and INV2 that are connected in series, and when the voltage of the drain voltage V2 exceeds a prescribed threshold value, the flip-flop FF1 is reset. When the flip-flop FF1 is reset, the n-type MOSFET (N1) is switched ON, thereby discharging the charge of the capacitor C3 via the n-type MOSFET (N1) and setting the drain voltage V2 to a low level (L).

Meanwhile, the drain voltage V2 is input via an inverter circuit INV4 to a D flip-flop FF2 as a trigger signal. The D flip-flop FF2 takes the fall in the output V3 of the inverter circuit INV4 as an input trigger signal, and therefore once the signal voltage V1 rises, the D flip-flop FF2 captures the output V4 of a comparator COMP4 after a prescribed delay period D1 has elapsed. The D flip-flop FF2 then maintains the output V4 of the comparator COMP4 until the next trigger signal is input.

Here, the comparator COMP4 evaluates the voltage of the output terminal OUT that switches the switching device 4 ON and OFF. More specifically, the comparator COMP4 compares the voltage of the output terminal OUT as detected by being voltage-divided via resistors R7 and R8 to a reference voltage Vlow and thereby determines whether a short-circuit has occurred between the source and gate of the switching device 4. The comparator COMP4 sets the output V4 to the high level (H) when the voltage detected by being voltage-divided is greater than the reference voltage Vlow and sets the output V4 to the low level (L) when the voltage detected by being voltage-divided is less than the reference voltage Vlow.

The output V5 of the D flip-flop FF2 that maintains the output V4 of the comparator COMP4 as described above is input to a counter COUNT and to a flip-flop FF3. The counter COUNT is constituted by a plurality of cascade-connected D flip-flops, for example, and counts a prescribed clock signal when the output V5 of the flip-flop FF2 is at the low level (L) to generate a divided frequency output.

Here, the flip-flop FF3 is reset by the output V5 received from the D flip-flop FF2 and is set by the divided frequency output of the counter COUNT. As a result, the flip-flop FF3 inverts in state according to the output V5 of the flip-flop FF2 after a delay period D2 corresponding to the time required for the counter COUNT to count the clock signal. Therefore, as illustrated in FIG. 3, the flip-flop FF3 outputs the short-circuit detection signal PROT when the voltage of the output terminal OUT as evaluated by the comparator COMP4 decreases (that is, after the prescribed delay periods D1 and D2 have elapsed after detection of a short-circuit between the source and gate of the switching device 4).

Then, the short-circuit detection signal PROT output from the flip-flop FF3 is output via an n-type MOSFET (N2) driven at a constant voltage by a voltage buffer circuit. Moreover, an n-type MOSFET (N3) is connected in series via a resistor R9 to the n-type MOSFET (N2) as an active load that switches ON when the short-circuit detection signal PROT is output.

The short-circuit detection circuit 20 configured as described above operates as illustrated by the voltage waveforms of each component in FIG. 3. In other words, when the output signal (the voltage V1) for switching ON the switching device 4 is at the high level (H) and the voltage of the OUT terminal becomes equal to a ground voltage GND, the output of the flip-flop FF3 inverts after the delay periods D1 and D2 determined by the D flip-flop FF2 and the counter COUNT. Moreover, when the output of the flip-flop FF3 inverts, the short-circuit detection circuit 20 outputs the short-circuit detection signal PROT indicating that the switching device 4 has short-circuited.

When this happens, the short-circuit detection signal PROT is received and prevents the flip-flop 15 from being set by the output of the zero-current detector (comparator) 11. As a result, the ON switching of the switching device 4 is suspended, and the flip-flop 15 is instead set by the output of the restart timer circuit 22. Therefore, as illustrated in FIG. 3, the ON/OFF period of the switching device 4 is set to a longer value (t2'), and the OFF time of the switching device 4 becomes longer than during normal operation (that is, when there are no short-circuits). In other words, the operating frequency at which the switching device 4 is switched ON and OFF is reduced.

Furthermore, the short-circuit detection signal PROT is applied to the COMP terminal, thereby gradually correcting (reducing) the voltage of the error voltage Verr output from the error amplifier 12 and input to the PWM control circuit (comparator) 13. As a result, as illustrated in FIG. 3, the time required for the voltage of the ramp signal RAMP to reach the voltage of the error voltage Verr (COMP terminal) that is input to the PWM control circuit 13 gradually decreases, and the ON time t1 of the switching device 4 is gradually reduced (to t1'). Moreover, reducing the ON time t1 of the switching device 4 reduces the current output from the controller 7 to the switching device 4 in which the source and gate are short-circuited, thereby preventing overcurrent damage to the controller 7. More specifically, the ON time t1 of the switching device 4 is gradually reduced by applying the short-circuit detection signal PROT to the COMP terminal after a prescribed period of time from when the short-circuit is detected has elapsed.

Therefore, the switching power supply (power factor correction converter) PFC including the controller 7 that controls the ON/OFF switching of the switching device 4 as described above makes it possible to effectively prevent extremely large currents from flowing out of the controller 7 via the output terminal OUT even if a short-circuit occurs between the source and gate of the switching device 4. In other words, extremely large currents can be prevented from flowing out of the controller 7 via the output terminal OUT even if a short-circuit occurs between the source and gate of the switching device 4 while mounting the switching device 4 and the controller (power supply IC) 7 on a prescribed circuit board, for example. This makes it possible to reliably prevent any damage to the controller 7 resulting from short-circuits between the source and gate of the switching device 4.

Furthermore, the short-circuit detection circuit 20 configured as described above simply outputs the short-circuit detection signal PROT to clamp the voltage applied to the COMP terminal. This makes it possible to set and reset the flip-flop 15 while maintaining a minimum ON time as the switching device 4 is switched ON and OFF. This, in turn, achieves a variety of advantageous effects, such as making it possible to quickly restore the functionality of the controller 7 once the external factor that caused the short-circuit between the source and gate of the switching device 4 is removed.

Meanwhile, if, for example, the ON/OFF switching of the switching device 4 were to be force-disabled when a short-circuit between the source and gate of the switching device 4 was detected, it would be difficult to reset the controller 7 even after removing the external factor that caused that short-circuit between the source and gate of the switching device 4. However, in the switching power supply (power factor converter) PFC according to the present invention, when the short-circuit detection circuit 20 detects a short-circuit, the ON time t1 of the switching device 4 is simply gradually reduced to be shorter than during normal operation. Therefore, in terms of restoring the functionality of the controller 7, the approach of outputting the short-circuit detection signal PROT to clamp the voltage applied to the COMP terminal as described above is extremely effective.

It should be noted that the present invention is not limited to the embodiment described above. For example, the configuration of the short-circuit detection circuit 20 may be modified in various ways according to the required specifications for the controller 7. Moreover, various conventionally proposed circuit configurations may be utilized as appropriate for the overall configuration of the switching power supply (power factor correction converter) PFC. In addition, various other modifications may be made without departing from the spirit of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A switching power supply, comprising:
a switching device connected in series to an inductance element and arranged between an input power supply and a ground terminal;
an output circuit that rectifies and smooths current output through the inductance element from the input power supply as the switching device is switched ON and OFF;
an output voltage control circuit that controls an ON time of the switching device on the basis of an error voltage between a prescribed reference voltage and a feedback voltage obtained by detecting an output voltage of the output circuit; and
a short-circuit detection circuit that detects a voltage applied to a control terminal of the switching device when the switching device is ON, determines that a short-circuit has occurred in the switching device if the voltage becomes less than a prescribed threshold value, and outputs a short-circuit detection signal to control operation of the output voltage control circuit so as to reduce the ON time of the switching device to be less than the ON time of the switching device when there is no short-circuit,
wherein the switching device is an n-type MOSFET, and
wherein the short-circuit detection circuit detects a voltage between a source and gate of the n-type MOSFET when the n-type MOSFET is switched ON by the output voltage control circuit.

2. The switching power supply according to claim 1, wherein the output voltage control circuit and the short-circuit detection circuit are integrated together as an integrated circuit that switches the switching device ON and OFF.

3. The switching power supply according to claim 1, wherein the short-circuit detection circuit outputs the short-circuit detection signal only after the voltage applied to the control terminal of the switching device remains less than the prescribed threshold value for a prescribed duration of time.

4. The switching power supply according to claim 3, wherein the output voltage control circuit, upon receiving the short-circuit detection signal, reduces an operating frequency at which the switching device is switched ON and OFF.

5. The switching power supply according to claim 3, wherein the short-circuit detection circuit superimposes the short-circuit detection signal onto a voltage difference between the feedback voltage and the prescribed reference voltage input to the output voltage control circuit.

6. The switching power supply according to claim 5, wherein the short-circuit detection circuit, after a prescribed period time from when a short-circuit is detected has elapsed, gradually reduces a voltage produced by superimposing the short-circuit detection signal onto the error voltage between the feedback voltage and the prescribed reference voltage input to the output voltage control circuit.

7. The switching power supply according to claim 1, wherein the output voltage control circuit, upon receiving the short-circuit detection signal, reduces an operating frequency at which the switching device is switched ON and OFF.

8. The switching power supply according to claim 1, wherein the short-circuit detection circuit superimposes the short-circuit detection signal onto a voltage difference between the feedback voltage and the prescribed reference voltage input to the output voltage control circuit.

9. The switching power supply according to claim 8, wherein the short-circuit detection circuit, after a prescribed period time from when a short-circuit is detected has elapsed, gradually reduces a voltage produced by superimposing the short-circuit detection signal onto the error voltage between the feedback voltage and the prescribed reference voltage input to the output voltage control circuit.

* * * * *